United States Patent [19]

Frederiksen et al.

[11] 4,092,611
[45] May 30, 1978

[54] ADAPTIVELY BIASED DIFFERENTIAL OPERATIONAL AMPLIFIER FOR PHOTO DIODE

[75] Inventors: Thomas M. Frederiksen; Robert S. Sleeth, both of San Jose; William M. Howard, Campbell, all of Calif.

[73] Assignee: National Semiconductor Corporation, Santa Clara, Calif.

[21] Appl. No.: 794,433

[22] Filed: May 6, 1977

[51] Int. Cl.$^2$ .................. H03F 3/45; G03B 7/00
[52] U.S. Cl. .................. 330/261; 250/214 A; 330/59; 330/257; 330/260; 354/60 R
[58] Field of Search ............ 250/214 A; 330/59, 69, 330/257, 260, 261; 354/29, 60 R

[56] References Cited

U.S. PATENT DOCUMENTS

| 3,530,378 | 9/1970 | Holle et al. | 330/69 X |
| 3,641,890 | 2/1972 | Ono | 354/60 R X |

Primary Examiner—Lawrence J. Dahl
Attorney, Agent, or Firm—Gail W. Woodward

[57] ABSTRACT

A differential amplifier has one input connected to a reference potential and a photo diode connected in series with a level shift to the other input. A negative feedback loop is also coupled into other input. This stabilizes the amplifier and, if the level shift is made equal to the reference potential, biases the photo diode to zero, thereby reducing leakage current. A second feedback loop is used to adaptively bias the tail current in the differential amplifier.

10 Claims, 1 Drawing Figure

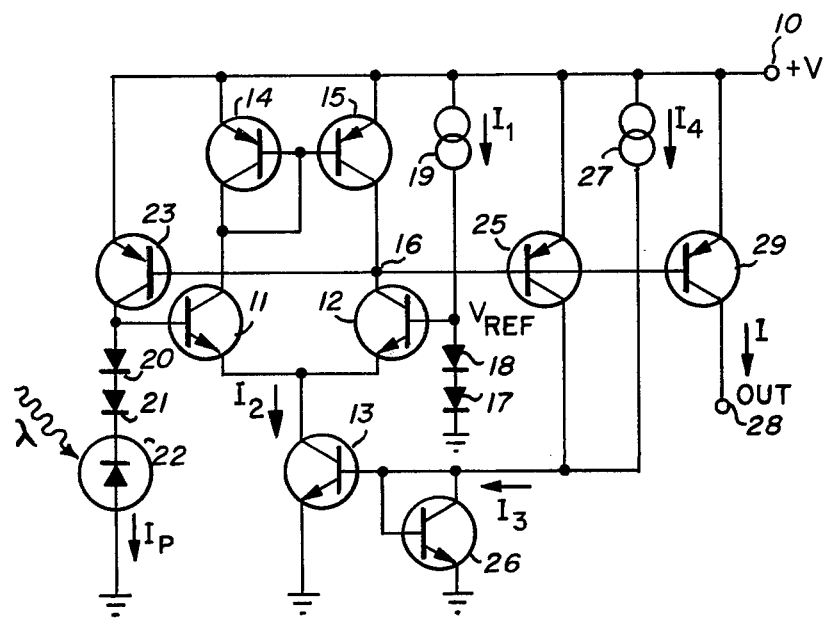

ADAPTIVELY BIASED DIFFERENTIAL OPERATIONAL AMPLIFIER FOR PHOTO DIODE

BACKGROUND OF THE INVENTION

The invention relates to circuitry for producing a current that is related to the intensity of illumination. One well known use of such circuitry is found in automatic cameras. The camera shutter and/or aperture is automatically operated to expose the film properly. One approach is to convert the illumination into a current (light domain to current domain converter) and the current used to control the camera (a current domain to mechanical domain converter). Silicon photo diodes have been found to have excellent properties for converting light into current. They are very linear in terms of current versus illumination, have the proper light wavelength response (when used with simple optical filters), display no undesired memory characteristics, and respond rapidly to changes in illumination so as to be useful in sensing the light produced by conventional flash units. For example, when the illumination is changing, as in the case of flash photography, use of the current domain makes it easy to record the incident light. A simple electronic circuit can integrate the current and indicate when sufficient light has been received to properly expose the film. It does not matter whether the light intensity varies or is steady so long as the quantity is integrated with respect to time.

Finally, and of great importance, is the fact that silicon photo diodes can be manufactured as an integral part of a silicon integrated circuit (IC). The photo diode is compatible electronically and process wise so that the complete electronic circuit used to operate a camera can be made using only one IC chip, if desired, manufactured with conventional bipolar technology. Two basic problems attend such IC designs. First the photo diode must sense light values that vary over about six orders of magnitude. This would involve viewing sunlit scenes as well as dimly lit rooms and even moonlit outdoor scenes. Second, even though silicon photo diodes are in fact quite linear in responding to low light intensity, their actual current values are at the nanoampere level. In silicon bipolar transistors this is into the range of P-N junction leakage. Thus, it has proven difficult to design bipolar IC configurations that can handle the large dynamic range and still be operative at the low current values.

SUMMARY OF THE INVENTION

It is an object of the invention to integrate a photo diode into a silicon bipolar IC amplifier where the current output varies linearly over at least six orders of magnitude.

It is a feature of the invention that the photo sensitive IC operates at low current drain and at low voltage to facilitate battery operation.

These and other objects and features are achieved as follows. A differential amplifier has one input biased at constant voltage by means of series connected forward biased diodes. The other input includes a level shifter having a similar series diode array coupled in series with a photo diode. A negative feedback loop having substantial gain is coupled from the differential amplifier output to the input containing the photo diode. A second feedback loop is coupled between the differential amplifier output and the tail current control transistor. The thus stabilized differential amplifier will be driven to hold the two input terminals at the same potential and, since the two inputs each contain the same number of diodes, the voltage across the photo diode will be driven to zero bias. This substantially eliminates photo diode leakage at a design value current which is programmed by the current supplied to the constant voltage input. At photo current values below this level, photo diode leakage is deliberately encouraged. The tail current control feedback causes the differential tail current to replicate the photo diode current and the amplifier is thus adaptively biased. This form of biasing provides good circuit linearity and causes input base current to be a constant percent error in amplifier operation.

BRIEF DESCRIPTION OF THE DRAWING

The single FIGURE of drawing is a schematic diagram of the circuit of the invention.

DESCRIPTION OF THE INVENTION

In the description that follows it will be assumed that conventional bipolar transistor IC process are employed. NPN transistors have minimum Beta of about 100 while PNP devices have Beta values of at least 50. These values are available at collector currents as low as 10 nanoamperes. At 300° K typical P-N junction leakage current can be held below a picoampere. For such transistors the base current is less than 2% of the collector current. Accordingly, in circuit analysis to a first approximation, the base currents can be regarded as negligible.

In the circuit of the drawing a positive power supply voltage is applied to terminal 10 with respect to ground. A differential amplifier composed of transistors 11 – 15 is coupled across the power supply. Differential pair transistors 11 and 12 have their emitters coupled together to the collector of transistor 13 which supplies the tail current. Transistors 14 and 15 are connected as a conventional active load so that node 16 constitutes the output of the differential amplifier.

The base of transistor 12 is operated at $V_{REF}$ which is $2V_{BE}$ above ground by means of diodes 17 and 18 and current source 19. Typically $I_1$ will be about 200 nanoamperes so that $V_{REF}$ will be about 1.2 volts at 300° K.

The base of transistor 11 is coupled through diodes 20 and 21 and photo diode 22 to ground. Transistor 23, acting as a common emitter amplifier, couples the output of the differential amplifier at node 16 with one inversion back to its noninverting input. This negative feedback stabilizes the differential amplifier. A second feedback loop includes transistor 25 which couples node 16 with one inversion to the base of transistor 13. Diode connected transistor 26 causes the collector current in transistor 13 to mirror the collector current of transistor 25. If transistor 23 and 25 are matched to have the same area, transistors 13 and 26 are matched to have the same area, and transistors 11 and 12 are matched to have the same area, any current that flows in photo diode 22 will flow in the collector of transistor 23. An equal current will therefore flow in the collector of transistor 25 and this current will be mirrored in the collector of transistor 13. Thus, neglecting the current $I_4$ flowing in source 27, $I_p$ will equal $I_2$ and $I_3$.

The current $I_2$ is called the "tail current" of the differential amplifier. As shown above, this current is preferably made equal to $I_p$. Thus the differential amplifier is adaptively current biased. This action prevents the base current in transistor 11 from becoming a major source of error in the circuit. Typically NPN transistors fabricated in IC form have a Beta, or current gain, of 100 – 200. If transistor 11 were fixed biased in the range of 100 microamperes, the base current would be on the order of 500 to 1000 nanoamperes. This would introduce gross errors at the lower illumination levels. With the adaptive biasing such errors are avoided.

For the circuit shown, photo diode 22 is typically selected to produce an $I_p$ of about 4 nanoamperes per foot candle of illumination. With source 19 operating at 200 nanoamperes, 50 foot candles of illumination (a typical illumination level in a well lit room) will operate transistor 23 at 200 nanoamperes and this illumination level will fully balance the differential amplifier currents.

At 0.5 foot candle illumination only 2 nanoamperes will flow. At this current level diodes 20 and 21 will have so little conduction that they will not develop the 0.6 volt drops needed to keep the base of transistor 11 at about $2V_{BE}$ above ground. This acts to force a reverse bias across photo diode 22 and thus generates an increased leakage current. Therefore at zero illumination the current does not go to zero but rather to some very low current. This characteristic is desired in automatic camera control systems so that at very low illumination the shutter of the camera will time out and close. If the photo current were to go to zero, the camera timing circuit would hang up and would never time out — a very undesirable condition.

Current source 27 is present in the circuit to provide start up operation. If current source 27 were not present, transistors 13 and 26 would not conduct and the circuit would not start. If current source 27 produces an $I_4$ of about one nanoampere, the bases of transistors 13 and 26 will be pulled up to conduction when +V is applied to terminal 10. In operation $I_3$ and $I_2$ will be $I_p$ + 1 nanoampere. In normal circuit operation this added 1 nanoampere can be neglected.

From the above, it can be seen that the circuit acts to linearly replicate the current in photo diode 22 except for the lowest illumination levels of fractional foot candle values. The circuit is adaptively biased in that the differential amplifier tail current is made substantially equal to the photo current.

The circuit output at terminal 28 is a replica of $I_p$. Transistor 29 has its base coupled to node 16 and therefore conducts in response to the bias on transistor 23. The uncommitted collector output can source current to a load coupled between terminal 28 and ground. If desired, a number of other transistors can be coupled to node 16 to source still other independent loads with an illumination related current. The only critical elements in the above-described circuit relate to simple transistor area controls which are easily achieved in integrated circuit manufacturing.

The circuit of the invention has been described and its performance characteristics set forth. Clearly there are alternatives and equivalents that will occur to a person of ordinary skill in the art. Accordingly, it is intended that the scope of the invention be limited only by the claims that follow.

We claim:

1. A circuit for replicating the current produced by a photo diode in response to illumination, said circuit comprising:

a differential amplifier having inverting and noninverting inputs, an output, and tail current control means;

means for applying a reference potential to said inverting input;

means for coupling a first inverting amplifier between said output and said noninverting input; and level shifting means coupled between said photo diode and said noninverting input, said level shifting means operative to produce a level shift of approximately said reference potential value whereby said photo diode is operated at substantially zero bias.

2. The circuit of claim 1 further including means for coupling a second inverting amplifier between said output terminal and said tail current control means whereby said circuit is adaptively biased in response to the level of said illumination.

3. The circuit of claim 2 wherein said tail current control means comprise a current mirror coupled to reflect the current flowing in said second inverting amplifier into said differential amplifier.

4. The circuit of claim 2 wherein said reference potential is generated by passing a forward bias current through a pair of P-N junction diodes and said level shifting means comprise a second pair of forward biased P-N junction diodes.

5. The circuit of claim 2 wherein a third inverting amplifier is coupled to said output of said differential amplifier to provide a buffered output replica of the current flowing in said photo diode.

6. A circuit adapted for connection to the terminals of a source of operating potential, said circuit comprising:

first and second transistor means coupled together as a differential amplifier pair, said pair having their collectors coupled by means an active load to the first terminal of said source with the collector of said second transistor comprising the output terminal of said differential amplifier;

third transistor means having its collector coupled to the emitters of said differential amplifier pair, its emitter coupled to the second terminal of said source, and a diode coupled between its base and emitter;

fourth transistor means, having complementary construction to that of said first, second, and third transistor means, said fourth transistor means having its emitter coupled to said first terminal, its base coupled to said output terminal of said differential amplifier, and its collector coupled to the base of said first transistor means;

fifth transistor means having construction like that of said fourth transistor means and having its emitter coupled to said first terminal, its base coupled to said output terminal of said differential amplifier, and its collector coupled to the base of said third transistor means;

first level shift means coupled between the base of said second transistor means and said second terminal;

a photo diode having one terminal coupled to said second terminal; and second level shift means coupled between the other terminal of said photo diode and the base of said first transistor means.

7. The circuit of claim 6 wherein said level shift means each comprise a plurality of series connected forward biased diodes with the number of diodes in said first level shift means being equal to the number in said second level shift means.

8. The circuit of claim 7 further including sixth transistor means having a construction like that of said fourth transistor means and having its emitter coupled to said first terminal, its base coupled to said output of said differential amplifier, and its collector comprising a current output source, said source replicating the photo current in said photo diode.

9. The circuit of claim 7 wherein said diodes are diode connected transistors and all transistors have the same emitter areas.

10. The circuit of claim 9 further including a starting current source coupled between the emitter and collector electrodes of said fifth transistor means, said current source having a current value approximating the lowest useful current produced by said photo diode.

* * * * *